(12) United States Patent
Wang et al.

(10) Patent No.: US 11,152,404 B2
(45) Date of Patent: Oct. 19, 2021

(54) TUNNEL CONTACT FOR A PIXEL CELL IN AN IMAGING SYSTEM

(71) Applicant: OmniVision Technologies, Inc., Santa Clara, CA (US)

(72) Inventors: Qin Wang, San Jose, CA (US); Woon il Choi, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 146 days.

(21) Appl. No.: 16/723,922

(22) Filed: Dec. 20, 2019

(65) Prior Publication Data

US 2021/0193723 A1 Jun. 24, 2021

(51) Int. Cl.
*H01L 27/146* (2006.01)

(52) U.S. Cl.
CPC .. *H01L 27/14603* (2013.01); *H01L 27/14614* (2013.01); *H01L 27/14636* (2013.01); *H01L 27/14641* (2013.01); *H01L 27/14643* (2013.01); *H01L 27/14689* (2013.01)

(58) Field of Classification Search
CPC ......... H01L 27/14636; H01L 27/14603; H01L 27/14643; H01L 27/14689; H01L 27/14641; H01L 27/14609–14616; H01L 27/14683–14698; H01L 27/14614; H04N 5/335–379
See application file for complete search history.

(56) References Cited

U.S. PATENT DOCUMENTS

| 6,930,338 | B2 | 8/2005 | Lee | |
|---|---|---|---|---|
| 2014/0077271 | A1* | 3/2014 | Fujii | H01L 27/14609 257/239 |
| 2016/0013239 | A1* | 1/2016 | Kasaoka | H01L 27/14627 257/225 |
| 2016/0112664 | A1* | 4/2016 | Kido | H01L 27/14614 257/292 |
| 2018/0182794 | A1* | 6/2018 | Go | H01L 27/14612 |
| 2018/0227516 | A1* | 8/2018 | Mo | H04N 5/378 |
| 2019/0148438 | A1* | 5/2019 | Lee | H01L 27/14641 257/432 |
| 2019/0222781 | A1* | 7/2019 | Lim | H01L 27/14612 |

* cited by examiner

*Primary Examiner* — Scott B Geyer
(74) *Attorney, Agent, or Firm* — Christensen O'Connor Johnson Kindness PLLC

(57) ABSTRACT

A pixel cell includes an electrically conductive tunnel contact formed across a surface of a source follower gate, the tunnel contact having a first end, a second end, and an intermediate portion between the first and second ends. The first end is coupled to a floating diffusion FD, the second end is coupled to the first doped region of a reset transistor RST. The tunnel contact is formed in physical and in electrical contact with the surface of the source follower gate for a length of the intermediate portion substantially equal to a width of the source follower gate. Methods of forming the pixel cell are also described.

31 Claims, 8 Drawing Sheets

A-A' CROSS SECTION

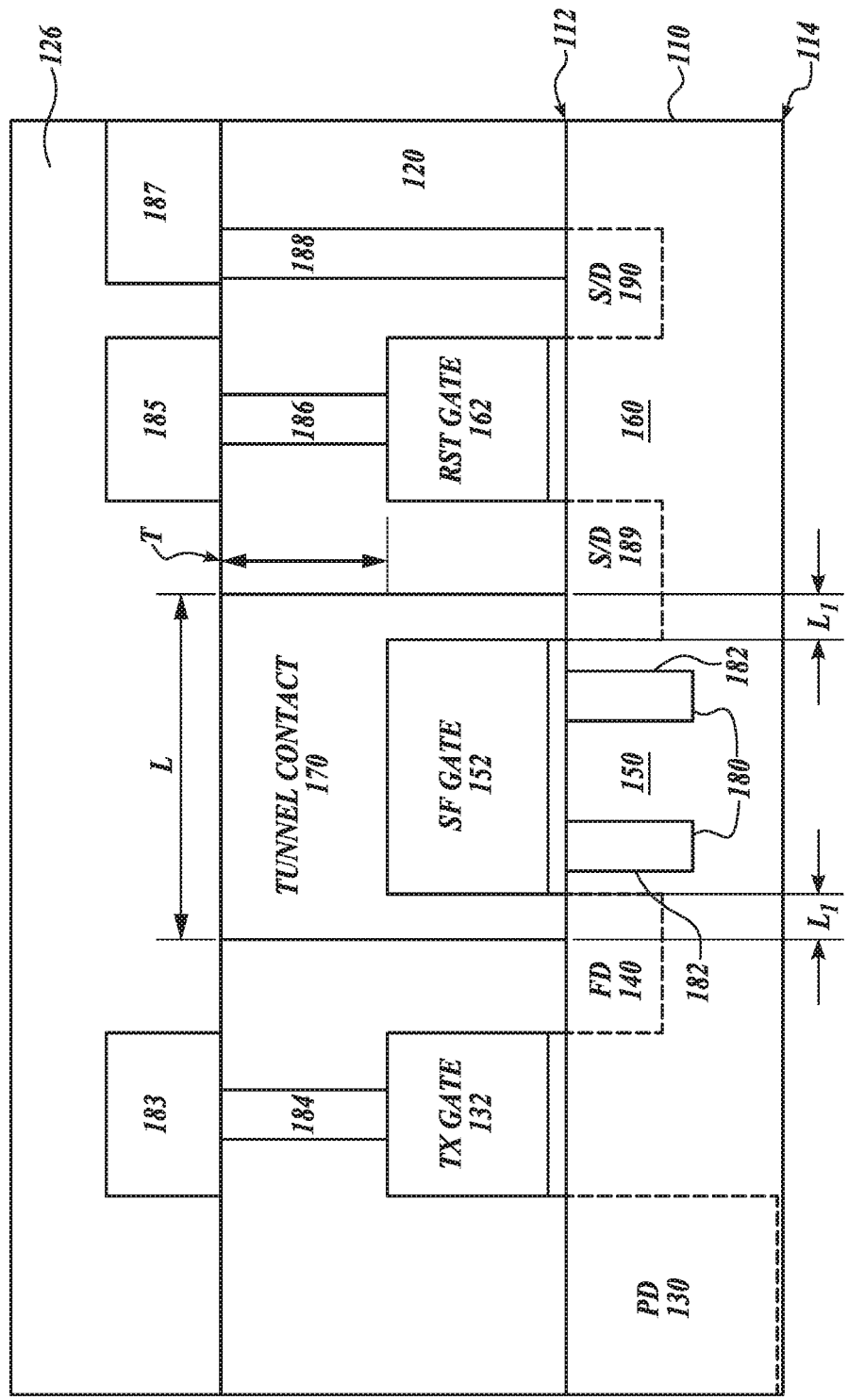

TUNNEL CONTACT FOR A PIXEL CELL IN AN IMAGING SYSTEM

BACKGROUND INFORMATION

Field of the Disclosure

This disclosure relates generally to image sensors, and in particular but not exclusively, relates to interconnect structures in image sensors.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The technology used to manufacture image sensors has continued to advance at a great pace. The demands of higher resolution and lower power consumption have encouraged the further miniaturization and integration of these devices. Combined with the demands for image sensors with high dynamic range and low light sensitivity have made the designs of pixel cells with high conversion gain and a high signal to noise ratio increasingly challenging.

It is believed that low noise is important to the detection of weak light for an image sensor, and that high conversion gain provides a pathway to achieving low noise. Conventionally, a floating diffusion is connected to a source follower gate of a pixel cell via multiple contacts that are coupled to each other via a metal line in a metallic interconnection layer that is surrounded by the dielectric material of an inter-layer dielectric layer of an image sensor chip. The electric coupling between the floating diffusion and the source follower gate through the inter-layer dielectric layer can introduce parasitic capacitance, which increases the effective capacitance of the floating diffusion and lowers the conversion gain.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

FIG. 1B is a cross-section view illustrating one example of a portion of a pixel cell including a tunnel contact in accordance with the teachings of the present disclosure.

Figure 1A:
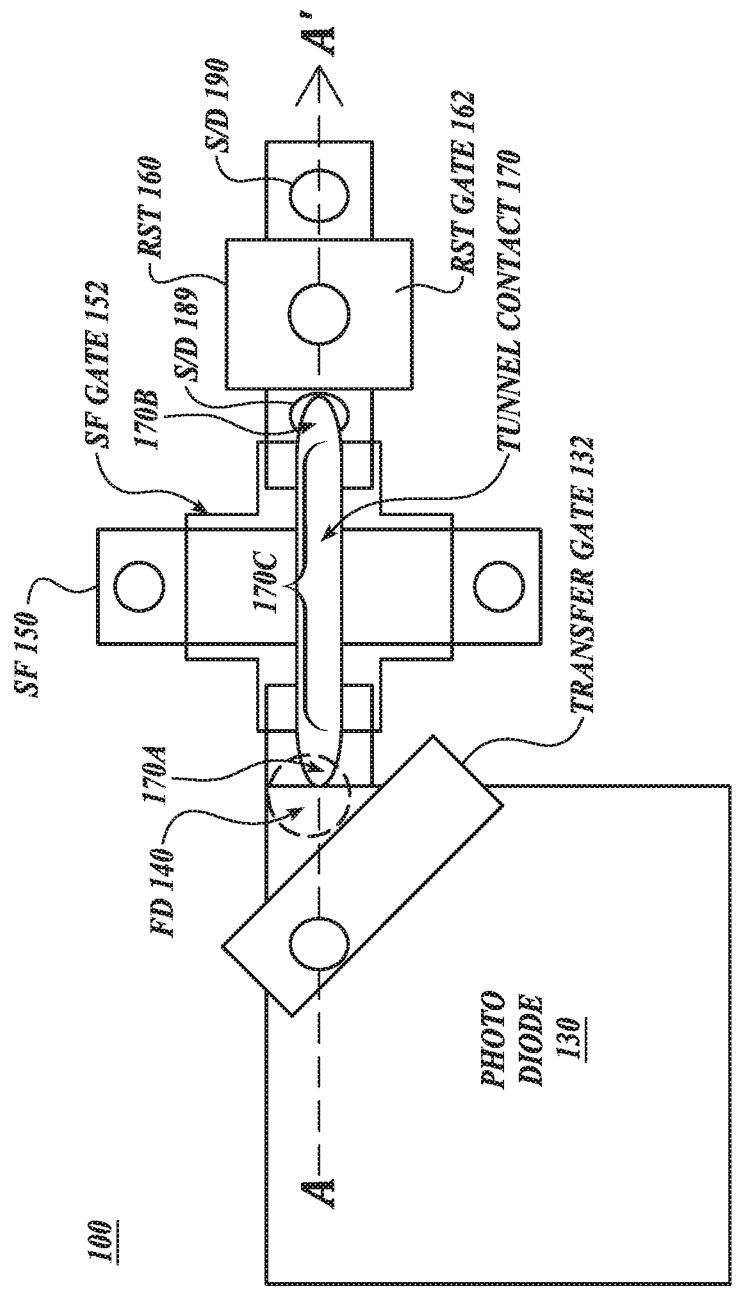
FIG. 1A is a plan view illustrating one example of a portion of a pixel cell including a tunnel contact in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses and methods directed to pixel cells with a tunnel connect are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Furthermore, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, examples in accordance with the teachings of the present invention are directed to a pixel cell that includes a tunnel contact that is formed across a surface of the gate electrode of a source follower. One end of the tunnel contact is coupled to the floating diffusion and the other end of the tunnel contact is coupled to the reset transistor. In the example, an intermediate portion of the tunnel contact between the ends of the tunnel contact is in physical and in electrical contact with the surface of the source follower gate for a length at least substantially equal to a width of the source follower gate. Thus, the tunnel contact couples the floating diffusion to the source follower gate and to the reset transistor. As such, the tunnel contact replaces a traditional metal line in a metallic interconnection layer through the dielectric material of the inter-layer dielectric layer. Accordingly, an example tunnel contact in accordance with the teachings of the present disclosure increases conversion gain associated with the floating diffusion by reducing parasitic capacitance between the floating diffusion and the metallic interconnection. In some embodiments, by adjusting the thickness of the tunnel contact, parasitic capacitance can be further reduced.

Examples of the pixel cell of the present disclosure offer numerous advantages. For example, the pixel cell can be made using existing methods and therefore does not require a new process or equipment. The pixel cell can reduce floating diffusion capacitance and/or increase conversion gain, reduce noise, increase low light detectivity, provide high dynamic range, or any combination thereof.

To illustrate one example of a pixel cell, FIG. 1A is a plan view of a pixel cell including a tunnel contact in accordance with the teachings of the present disclosure. Pixel cell 100 includes a floating diffusion FD 140 that is disposed in a semiconductor material 110 (e.g., silicon substrate). The floating diffusion 140 is coupled to receive image charge from a photodiode PD 130 disposed in the semiconductor material 110. Referring also to FIG. 1B, which is a A-A' cross section view illustrating a portion of the example of a pixel cell shown in FIG. 1A, the semiconductor material 110 has a first side 112 and a second side 114 opposite the first side. In some embodiments, the first side 112 is referred to as the front side of the semiconductor material 110 and the second side 114 is referred to as the backside of the semiconductor material 110. In some embodiments, the first side 112 is referred to as the non-illuminated side of the semiconductor material 110 and the second side 114 is referred to as the illuminated side of the semiconductor material 110. In some embodiments, image charges are photogenerated by the photodiode 130 in response to an incident light impinging onto the photodiode PD 130 from the second side 114 (e.g., backside) of the semiconductor material 110. As an example, the incident light can be directed to photodiode PD 130 by a respective micro-lens (not shown) on the second side 114.

Referring again to FIG. 1B, pixel cell 100 has an inter-layer dielectric layer 120 overlaying the semiconductor material 110, where, as shown, the inter-layer dielectric layer 120 is formed on the first side 112 of the semiconductor material 110. A transfer TX gate 132 is disposed over the first side 112 of the semiconductor material 110 proximate to the photodiode PD 130 and the floating diffusion FD 140. Referring to FIGS. 1A and 1B, a reset transistor RST 160 has first and second doped regions 189 and 190 in the semiconductor material 110 and a reset transistor gate 162 disposed over the semiconductor material 110 between the first and second doped regions of the reset transistor 160; a source follower transistor SF 150 has a source follower SF gate 152 disposed over the semiconductor material 110 and disposed laterally between the transfer gate 132 and the reset gate 162.

In some embodiment, the semiconductor material 110 is of a first conductive type. The photodiode PD 130, the floating diffusion FD 140, and the first and second doped regions 189 and 190 are of a second conductive type having an opposite polarity relative to the first conductive type. For example, the semiconductor material 110 can be doped with P-type dopants such as boron (B), while the floating diffusion FD 140, and the first and second doped regions 189 and 190 can be formed by implanting N-type dopants such as arsenic (As) and/or phosphorus (P) into the semiconductor material 110 to provide N-type doped regions. However, it is appreciated that the polarity may be reversed, such that the semiconductor material 110 can be doped with N-type dopants, while the floating diffusion FD 140, and the first and second doped regions 189 and 190 can be formed by implanting P-type dopants.

The inter-layer dielectric layer can include a dielectric material. Dielectrics include, but are not limited to, silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or other suitable dielectric material, or any combination thereof.

Referring again to FIGS. 1A and 1B, a tunnel contact 170 is formed across a surface of the source follower SF gate 152, the tunnel contact 170 having a first end 170A, a second end 170B, and an intermediate portion 170C between the first and second ends. The tunnel contact 170 couples the floating diffusion 140 to both the source follower gate 152 and the first doped region 189 of the reset transistor 160. As shown in FIG. 1A, The first end 170A of the tunnel contact 170 is coupled to the floating diffusion 140, and the second end 170B of the tunnel contact 170 is coupled to the first doped region 189 of the reset transistor 160. In one example, the first doped region 189 is the source of the reset transistor 160 and the second doped region 190 is the drain of the reset transistor 160, the second end 170B is coupled to the source region of the reset transistor 160, and the drain region of the reset transistor is coupled to a voltage supply AVD to receive a reset voltage. The tunnel contact 170 is formed in physical and electrical contact with a surface (e.g., the surface on the side opposite the underlying semiconductor material 110) of the source follower gate 152 for a length of the intermediate portion 170C substantially equal to a width (e.g., physical gate width) of the source follower gate 152. In embodiments, the first end 170A is in direct contact with floating diffusion 140 and the second end 170B is in direct contact with the first doped region 189. In some embodiments, the first end 170A is in direct contact with a floating diffusion contact (not shown for simplicity) for the floating diffusion 140 and the second end 170B is in direct contact with a source contact (not shown for simplicity) for the first doped region 189 (e.g., the source region) of the reset transistor 160. In one embodiment, the intermediate portion 170C is greater than at least the width of the source follower gate 152, such that the entire width of the source follower gate 152 is encompassed by the tunnel contact.

In some embodiments, the tunnel contact has a length of 0.3 μm or more (e.g., 0.4 μm or more, 0.5 μm or more, 0.6 μm or more) and 0.7 μm or less (e.g., 0.6 or less, 0.5 μm or less, or 0.4 μm or less). In one example, the tunnel contact can have a length L of greater or equal to 0.3 and less than 0.5 μm depending on the width of the source follower gate 152 and the distance between the floating diffusion 140 and the source follower gate 152, and between the source follower gate 152 and the first doped region 189 of the reset transistor 160. For example, the tunnel contact can have a length L1 that exceeds an edge of the source follower gate 152 edge by 0.07 μm or more (e.g., 0.08 μm or more, 0.09 μm or more, or 0.1 μm or more) and 0.15 μm or less (e.g., 0.14 μm or less, 0.13 μm or less, 0.12 μm or less, 0.11 μm or less, or 0.1 μm or less). As another example, the tunnel contact can have a length L1 between 0.09 μm and 0.1 μm depending on the minimum critical dimension for photolithography. The tunnel contact 170 can include or can be formed of an electrically conductive material, such as tungsten (W), aluminum (Al), polysilicon (e.g., n-type doped polysilicon).

Referring to the example depicted in FIG. 1B, the tunnel contact 170 can have a thickness T extending from the top surface of the source follower gate 152 up to the upper surface of the inter-layer dielectric layer 120. As shown in FIG. 1B, the tunnel contact 170 can have a height that is equal to the upper surface of the inter-layer dielectric layer 120. However, as will be described below, in some embodiments, the tunnel contact 170 can have a height that is less than the upper surface of the inter-layer dielectric layer 120. Thus, in one example, the tunnel contact 170 can have a thickness T of 1000 Å or more (e.g., 1200 Å or more, 1400 Å or more, 1600 Å or more, or 1800 Å or more) and/or 2000 Å or less (e.g., 1800 Å or less, 1600 Å or less, 1400 Å or less, or 1200 Å or less).

In one example, referring to FIGS. 1A and 1B, a transfer gate 132 of a transfer transistor is disposed over the semiconductor material 110 between the photodiode 130 and the floating diffusion 140. In the example, the transfer gate 132 is coupled to selectively transfer the image charge from the photodiode 130 (which can be referred to as a source of the transfer transistor) to the floating diffusion 140 (which can be referred to as a drain of the transfer transistor) in response to a transfer control signal TX (e.g., a signal with positive voltage level) coupled to be received by the transfer gate 132 during a charge transfer operation of the pixel cell 100.

Figure 1C:
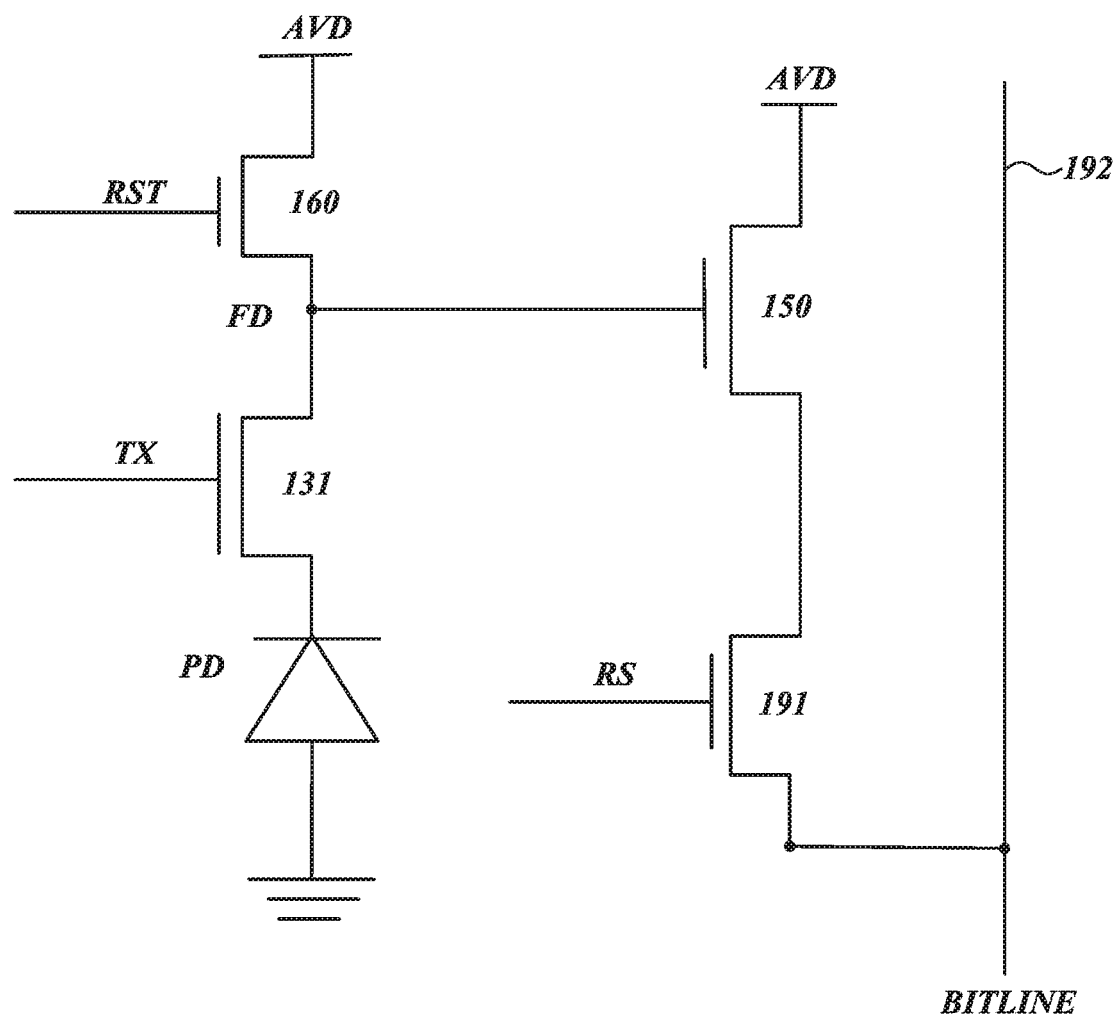
FIG. 1C is a schematic illustrating one example of a pixel cell in accordance with the teachings of the present disclosure.

Referring to FIG. 1C, which a schematic illustrating one example of a pixel cell in accordance with the teachings of the present disclosure, the reset transistor 160 is coupled between the voltage supply AVD and the floating diffusion 140 to reset the pixel cell 100, including resetting the floating diffusion 140 and/or the photodiode 130, in response to a reset signal RST coupled to be received by the reset gate 162 during a reset operation of pixel cell 100. The source follower transistor 150 is coupled to the floating diffusion 140 and the voltage supply AVD to convert the image charges stored in the floating diffusion 140 into a pixel output signal. Thus, the source follower transistor 150 operates to modulate the pixel output signal based on the voltage outputted by the floating diffusion 140 and received at the source follower gate 152, where the pixel output signal corresponds to the amount of photoelectrons accumulated in photodiode 130 during the integration period of pixel cell 100. A row select transistor (191) is coupled to the source follower transistor 150, for example, the source of the source follower transistor 150, to output the pixel output signal from the source follower transistor 150 to an output bitline (192) in response to a select signal RS.

Referring again to the example depicted in FIG. 1B, the pixel cell 100 can have one or more (as shown, two) trench isolation structures 180 in the semiconductor material layer 110 below the source follower gate 152 and proximate to a channel region of the source follower transistor 150. The edges of the source follower gate 152 extend laterally beyond outer edges 182 of the trench isolation structures 180, such that the tunnel contact is not in physical or electrical contact with the trench isolation structures 180. Each of the one or more trench isolation structures 180 extends into the semiconductor material 110 from the first side 112 of the semiconductor material 110. The depth that each of the one or more trench isolation structures 180 extends into the semiconductor material 110 may be configured to be greater than the junction depth of the floating diffusion 140 and the first and second doped regions 189 and 190 of the reset transistor 160, thereby providing isolation between the floating diffusion 140 and the first and second doped regions 189 and 190 of the reset transistor 160. In some embodiments, each of the one or more trench isolation structures 180 can be a shallow trench isolation structure that is formed on the first side 112 of the semiconductor material 110.

Figure 2:
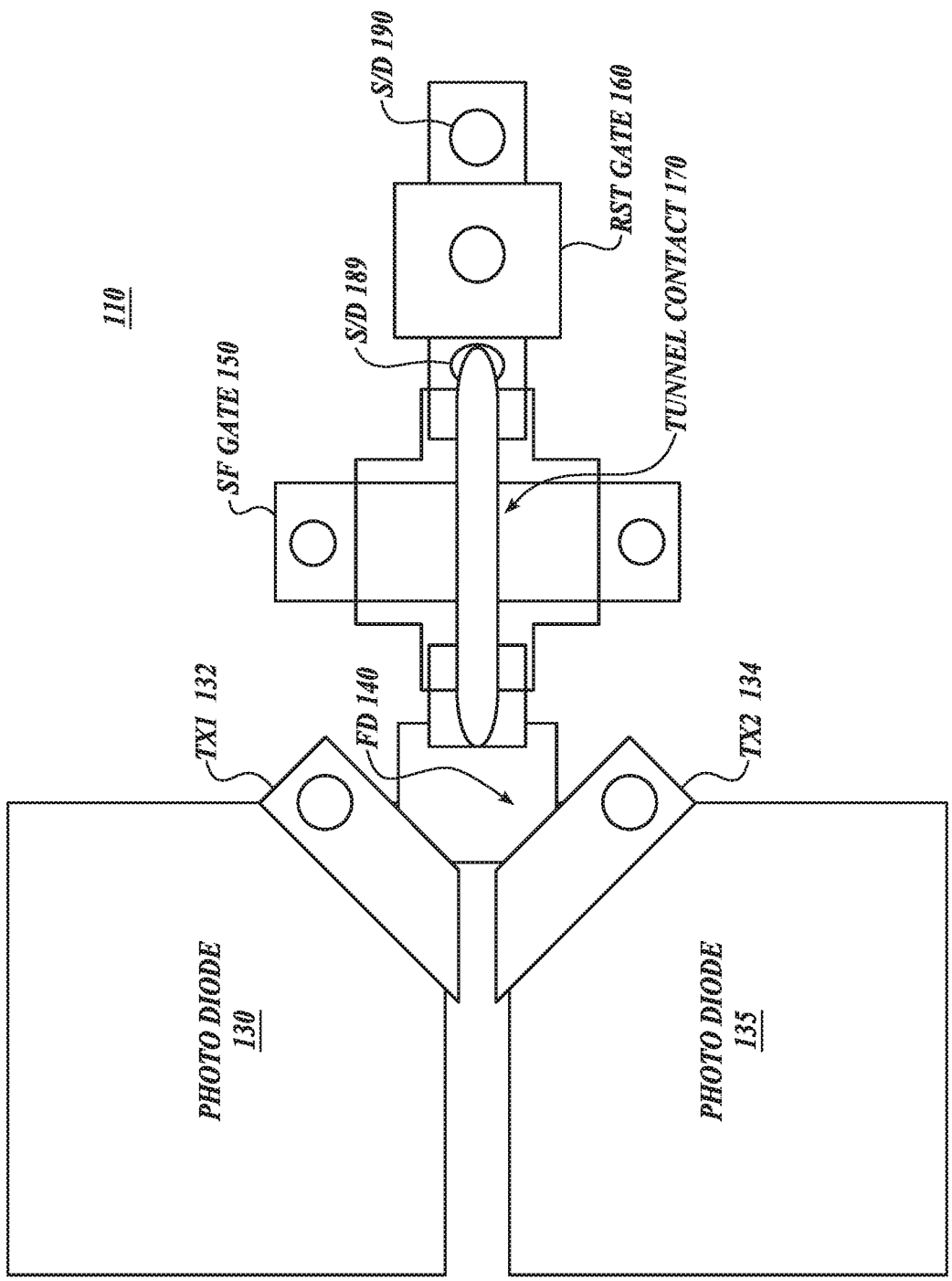
FIG. 2 is a plan view illustrating another example of a portion of pixel cell including a tunnel contact in accordance with the teachings of the present disclosure.

FIG. 2 is a plan view illustrating another example of a pixel cell including a tunnel contact in accordance with the teachings of the present disclosure. In the example depicted in FIG. 2, the pixel cell can include a plurality of photodiodes. For example, the pixel cell 100 can include a first photodiode 130 that can photogenerate image charge in response to incident light, and a first transfer gate 132 of a first transfer transistor disposed over the first side 112 of the semiconductor material 110 between the first photodiode 130 and the floating diffusion 140. The pixel cell also includes a second photodiode 135 disposed in the semiconductor material 110. A second transfer gate 134 of a second transfer transistor is disposed over the first side 112 of the semiconductor material 110 between the second photodiode 135 and the floating diffusion 140. Thus, the floating diffusion 140 is commonly shared by the first photodiode 130 and the second photodiode 135. The first transfer gate 132 of the first transfer transistor can selectively transfer image charges from the first photodiode 130 to the floating diffusion 140 in response to a first transfer control signal TX1 coupled to be received by the first transfer gate 132. The second transfer gate 134 of the second transfer transistor can selectively transfer image charges from the second photodiode 135 to the floating diffusion 140 in response to a second transfer control signal TX2 coupled to be received by the second transfer gate 134.

While FIG. 1B shows one example of a portion of a pixel cell having a single inter-layer dielectric layer 120, it is understood that the pixel cell, or a portion of a pixel cell, can include additional inter-layer dielectric layers overlaying the single inter-layer dielectric layer 120. In other words, the pixel cell may include one or more interlayer dielectric layers overlaying the semiconductor material 110. For example, the inter-layer dielectric layer 120 can be disposed between the semiconductor material 110 and one or more other inter-layer dielectric layers.

In one example, the pixel cell can include one or more metal layers embedded in the one or more inter-layer dielectric layers, for example, inter-layer dielectric layer 126 in FIG. 1B. In one example depicted by FIG. 1B, the one or more metal layers can include a first metal interconnect 183 coupled to provide a transfer control signal to the transfer gate 132, through a first contact 184 routed through the first inter-layer dielectric layer 120; a second metal interconnect 185 coupled to provide a reset control signal to the reset gate 162 through a second contact 186 routed through the first inter-layer dielectric layer 120; and/or a third metal interconnect 187 coupled to provide a reset voltage to the second doped region 190 (e.g., the drain region) of the reset transistor 160 through a third contact 188 routed through the first inter-layer dielectric layer 120.

In one example, the tunnel contact 170 formed across the surface of the source follower gate 152 is electrically isolated from the one or more metal layers embedded in the one or more inter-layer dielectric layers. As an example, the inter-layer dielectric layer 120 can include a dielectric material disposed between the tunnel contact 170 and the one or more inter-layer dielectric layers.

Figure 3:
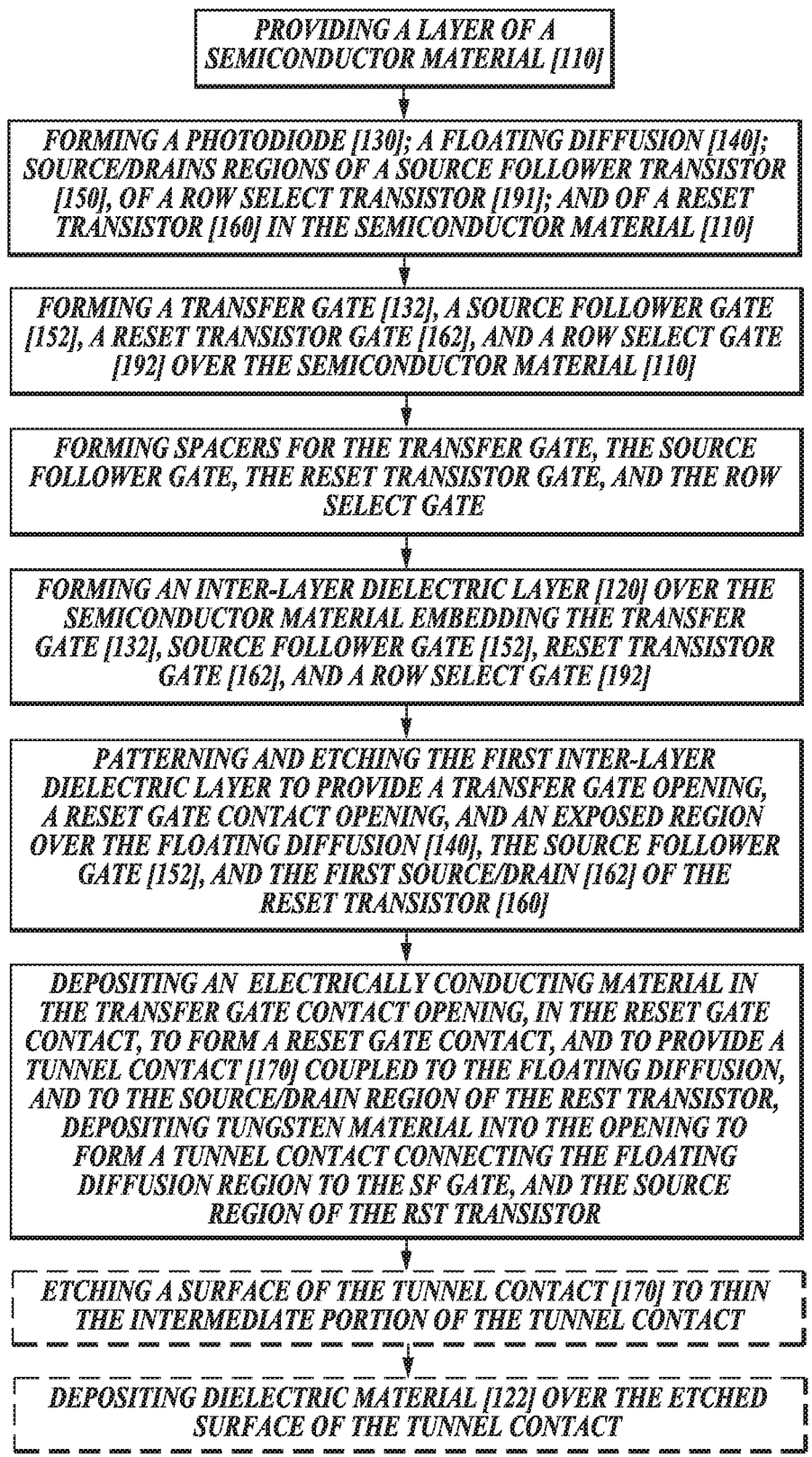
FIG. 3 is a flow chart illustrating one example of a process of making an example of a pixel cell in accordance with the teachings of the present disclosure.

FIG. 3 is a flow chart illustrating one example of a method of making an example of a pixel cell in accordance with the teachings of the present disclosure. Referring to the example method depicted in FIG. 3, in one example, the present disclosure features, inter alia, a method of making a pixel cell, including first providing a layer of a semiconductor material 110; then forming a photodiode 130, a floating diffusion 140, first and second doped regions (e.g., source and drain regions) of a source follower transistor 150, first and second doped regions (e.g., source and drain regions) of a row select transistor 191, and first and second doped regions 189 and 190 of a reset transistor 160 in the semiconductor material 110. A transfer gate 132, a source follower gate 152, a reset transistor gate 162, and a row select transistor gate 192 (not shown in the figures) can then be formed over the first side 112 of the semiconductor material 110. An inter-layer dielectric layer 120 can subsequently be deposited over the first side 112 of the semiconductor material 110, embedding the transfer gate 132, source follower gate 152, reset transistor gate 162, and a row select transistor gate 192. The inter-layer dielectric layer 120 is then patterned and etched (e.g., by wet chemical etching, which can be time controlled) to provide a first exposed region over the transfer gate 132 to form a transfer gate contact opening, a second exposed region over the reset gate 162 to form a reset gate contact opening, and a third exposed region over the floating diffusion 140 to form a floating diffusion contact opening, a fourth exposed region over the entire source follower gate 152, a fifth exposed region over the first doped region 189 of the reset transistor 160, and a sixth exposed region over the second doped regions 190 of the reset transistor 160 to form a reset drain contact opening. After patterning and etching, an electrically conductive material (e.g., tungsten) is deposited in the first exposed region, filling the transfer gate contact opening to form a transfer gate contact; in the second exposed region filling the reset gate contact opening to form a reset gate contact; in the third exposed region filling the floating diffusion contact opening over the floating diffusion 140; in the fourth exposed region over the source follower gate 152, in the fifth exposed region over the first doped region 189 to form a tunnel contact; and the sixth exposed region over the over the second doped regions 190 filling the reset drain contact opening to form a reset drain contact. As described above in FIG. 1A, the tunnel contact 170 is formed to connect the floating diffusion 140 to the source follower gate 152 and the first doped region 189 of the reset transistor 160. In one example, the tunnel contact is formed to have a first end 170A, a second end 170B, and an intermediate portion 170C between the first and second ends 170A and 170B. The first end 170A is coupled to the floating diffusion 140, the second end 170b is coupled to the first doped region 189 of the reset transistor 160, and the tunnel contact 170 is formed across a surface of the source follower gate 152 in physical and in electrical contact with a surface of the source follower gate 152 for a length of the intermediate portion 170C substantially equal to a width of the source follower gate 152. In one embodiment, the first end 170A is formed to be in contact with the floating diffusion 140, and the second end 170B is formed to be in contact with the first doped region 189 of the reset transistor 160.

In one example, the method further includes optionally etching a surface of the tunnel contact 170 to thin the intermediate portion 170C of the tunnel contact 170, to decrease the thickness T of the tunnel contact 170 extending from the top surface of the source follower gate 152 up to the upper surface of the inter-layer dielectric layer 120. When the height or the thickness T of the tunnel contact 170 is reduced to further reduce parasitic capacitance between the tunnel contact 170 and a metal interconnection structure (e.g., first metal layer) formed above the tunnel contact 170, this can contribute to the effective capacitance of the floating diffusion 140, thereby providing further improvement to increase the conversion gain of the floating diffusion 140.

Figure 4:
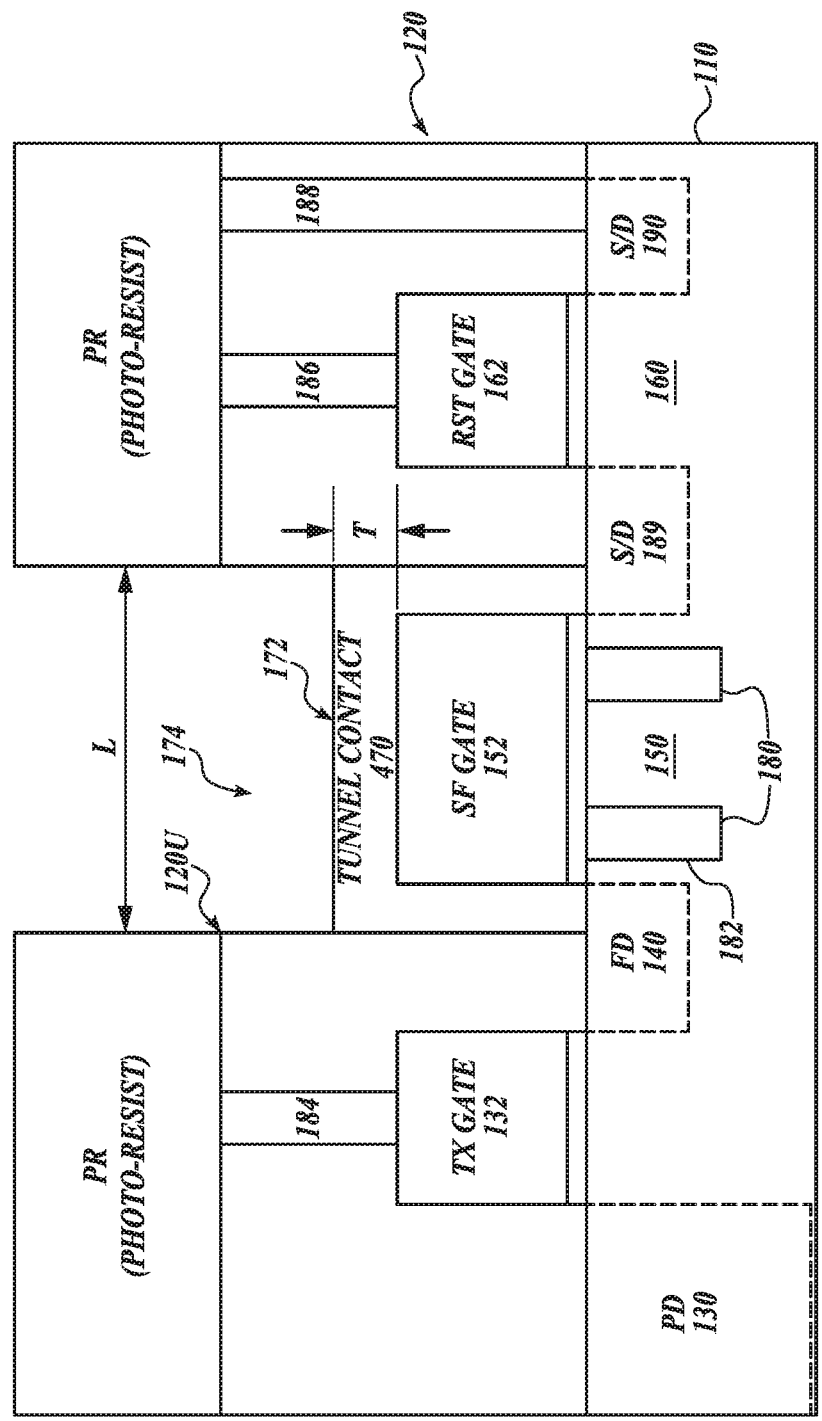
FIG. 4 is a cross section view illustrating another example of a portion of a pixel cell including a tunnel contact in accordance with the teachings of the present disclosure.

FIG. 4 is a cross section view illustrating a portion of another example of a pixel cell including a tunnel contact in accordance with the teachings of the present disclosure. Referring to the example depicted in FIG. 4, a tunnel contact 470 has been thinned such that its etched upper surface is below the upper surface of the surrounding inter-layer dielectric layer 120 to provide a gap 174 between an upper surface 172 of the tunnel contact 470 and an upper surface 120U of the inter-layer dielectric layer 120. In one embodiment, the thickness of the thinned tunnel contact 470 may range from 500 Å-1000 Å.

Figure 5:
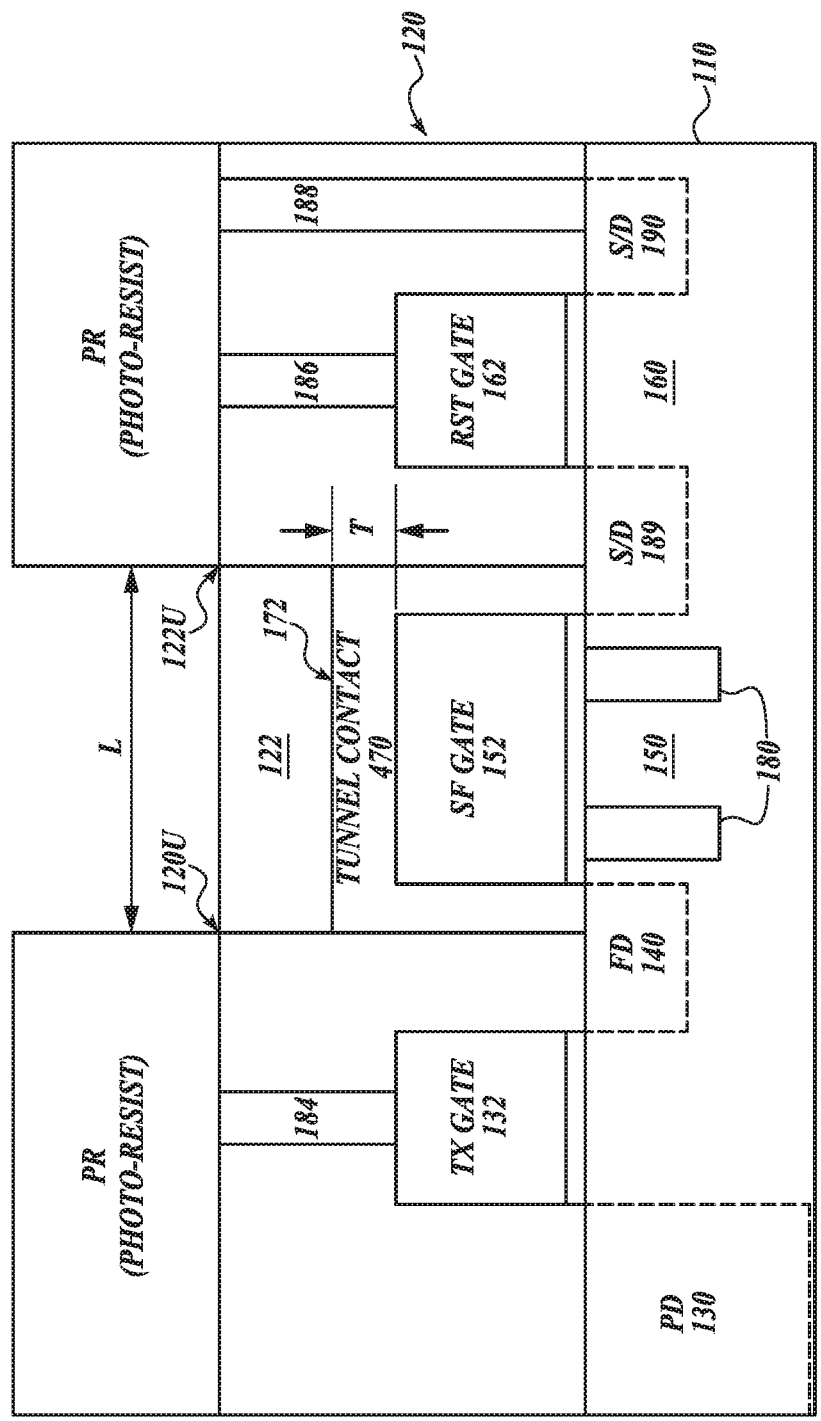
FIG. 5 is a cross section view illustrating yet another example of a portion of a pixel cell including a tunnel contact in accordance with the teachings of the present disclosure.

In one example, one or more dielectric materials 122 can optionally be deposited over the etched surface of the tunnel contact. If one or more dielectric materials 122 are deposited over the etched surface of the tunnel contact, the dielectric material can be deposited over the etched surface of the tunnel contact 470 to a same or lesser height compared to the upper surface 120U of the surrounding inter-layer dielectric layer 120. FIG. 5 is a cross section view illustrating a portion of yet another example of a pixel cell including a tunnel contact in accordance with the teachings of the present disclosure. Referring to the example depicted in FIG. 5, photo-resist PR is patterned and the upper surface 172 of tunnel contact 470 is etched to thin the tunnel contact 470. The inter-layer dielectric layer 120 is then backfilled with one or more dielectric materials 122 over the etched upper surface of the tunnel contact 470 to a same height relative to the upper surface 120U of the surrounding inter-layer dielectric layer 120. For example, the dielectric material can be deposited over the etched surface of the tunnel contact 470 to a height such that an upper surface 122U of the dielectric material 122 is coplanar with the upper surface 120U of the inter-layer dielectric layer. In some embodiments, the height of the dielectric material 122 can vary in a given pixel cell.

In one example, the dielectric material 122 can include one or more dielectric materials, each of which can be the same, or a different material as the material of the inter-layer dielectric layer 120. In one example, the dielectric material 122 can include a same material as the inter-layer dielectric layer 120. In another example, the dielectric material 122 includes a different dielectric material than a material of the inter-layer dielectric layer 120. The electrically conductive material can be deposited to a same height, or to a lesser height compared to an upper surface of the inter-layer dielectric layer.

In one example, when the pixel cell includes one or more additional inter-layer dielectric layers overlaying the first inter-layer dielectric layer 120 and the semiconductor material 110, the method further includes forming one or more other inter-layer dielectric layers over the first interlayer dielectric layer 120 such that the first inter-layer dielectric layer 120 is disposed between the semiconductor material 110 and the one or more other inter-layer dielectric layers. Each of the layers of the one or more inter-layer dielectric layers can include one or more dielectric materials, which can be the same, or a different material as the material of the inter-layer dielectric layer 120.

In one example, one or more metal layers can be embedded in the one or more inter-layer dielectric layers. The one or more metal layers can be provided by forming a first metal interconnect coupled to provide a transfer control signal to the transfer gate through the transfer gate contact routed through the first inter-layer dielectric layer; forming a second metal interconnect coupled to provide a reset control signal to the reset gate through the reset gate contact routed through the first inter-layer dielectric layer; and/or forming a third metal interconnect coupled to provide a reset voltage to the second doped region of the reset transistor through a third contact routed through the first inter-layer dielectric layer.

In one example, the method can further include chemical mechanical polishing of the pixel cell. Chemical mechanical polishing is applied to remove defects, to planarize the pixel surface (e.g., to planarize the inter-layer dielectric layer 120 and the dielectric material 122, respectively, after deposition), and to define the final thickness. Chemical mechanical polishing can be time controlled.

Figure 6:
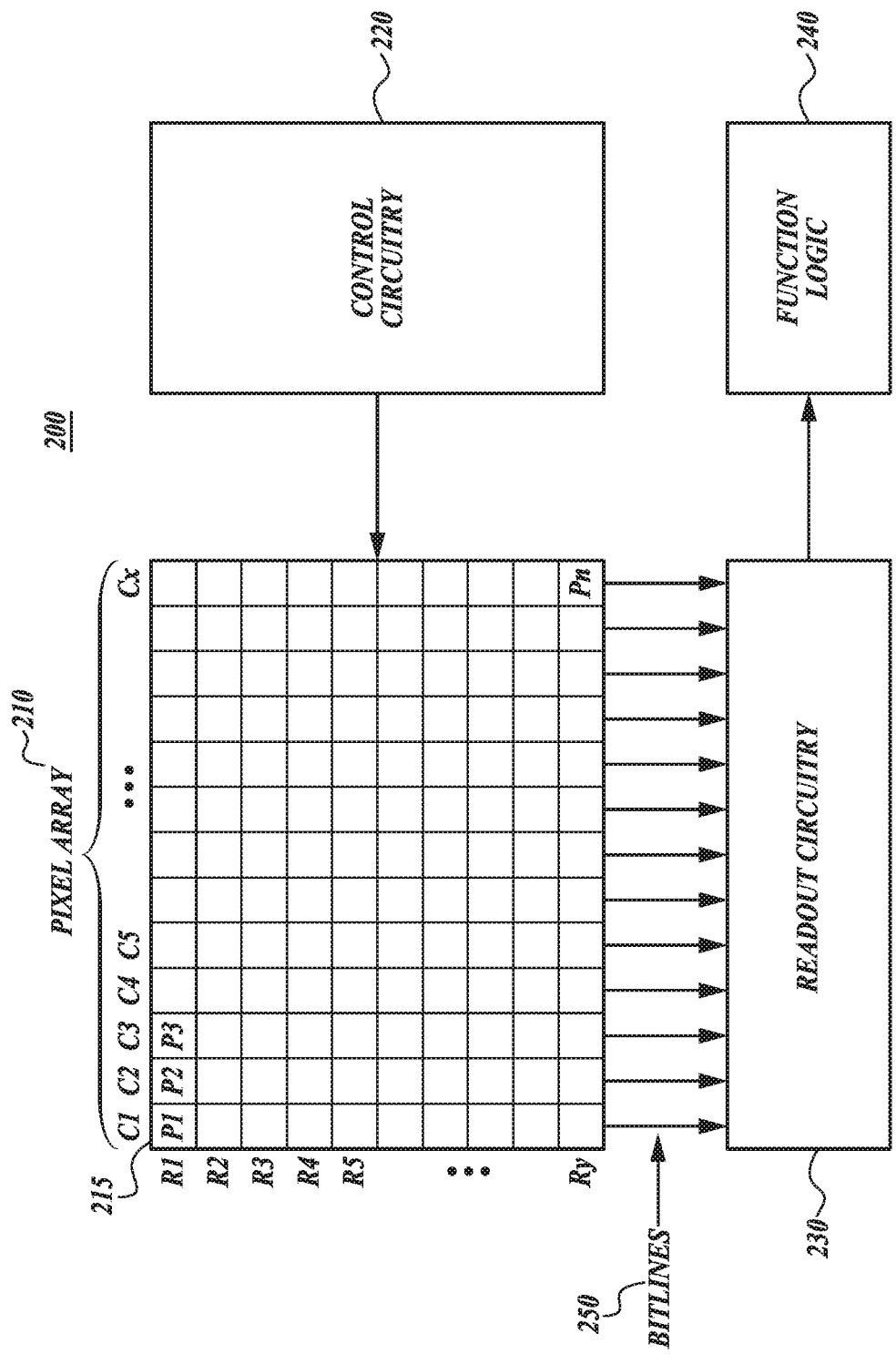
FIG. 6 is a schematic illustrating one example of an imaging system including a pixel array having pixel cells in accordance with the teachings of the present disclosure.

FIG. 6 is a block diagram illustrating one example of imaging system 200. Imaging system 200 includes a pixel array 210, control circuitry 220, readout circuitry 230, and function logic 240. In one example, pixel array 210 is a two-dimensional (2D) array of photodiodes, or image sensor pixels 215 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and can take other configurations.

In one example, after the image sensor photodiode/pixel 215 in pixel array 210 has acquired its image data or image charge, the image data is readout by readout circuitry 230 through output bitlines 250 and then transferred to function logic 240. In various examples, readout circuitry 230 can include amplification circuitry, analog-to-digital (ADC) conversion circuitry, or otherwise. Function logic 240 can simply store the image data or even manipulate the image data by applying post image effects (e.g., crop, rotate, remove red eye, adjust brightness, adjust contrast, or otherwise). In one example, readout circuitry 230 can read out a row of image data at a time along readout column lines (illustrated) or can readout the image data using a variety of other techniques (not illustrated), such as a serial readout or a full parallel readout of all pixels simultaneously.

In one example, control circuitry 220 is coupled to pixel array 210 to control operation of the plurality of photodiodes in pixel array 210. For example, control circuitry 220 can generate a shutter signal for controlling image acquisition. In one example, the shutter signal is a global shutter signal for simultaneously enabling all pixels within pixel array 210 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects, such as a flash.

Referring the example depicted in FIG. 6, an imaging system 200 can include a pixel array 210 including a plurality of pixel cells 215 as described in the present disclosure, a control circuitry 220 coupled to the pixel array 210 to control operation of the pixel cells 215; and a readout circuitry 230 coupled to the pixel array 210 to read out image data from the pixel cells 215. The imaging system can further include function logic 240 coupled to the readout circuitry to store image data from the pixel array.

In one example, each one of the pixel cells 215 of the pixel array 210 in the imaging system 200 can having structure similar to pixel cell 100 of FIG. 1B or the pixel cell depicted in FIG. 5. Each one of the pixel cells 215 can include a floating diffusion disposed in a semiconductor material and coupled to receive image charge from a photodiode disposed in the semiconductor material; a transfer gate disposed over the semiconductor material proximate to the photodiode and the floating diffusion; a reset transistor having first and second doped regions in the semiconductor material and a reset gate embedded disposed over the semiconductor material between the first and second doped regions of the reset transistor; a source follower transistor having a source follower gate disposed over the semiconductor material and disposed laterally between the transfer gate and the reset gate; and a tunnel contact formed across a surface of the source follower gate. In one example, the tunnel contact has a first end, a second end, and an intermediate portion between the first and second ends. The first end is coupled to the floating diffusion, the second end is coupled to the first doped drain region of the reset transistor, and the tunnel contact is formed in physical and in electrical contact with a surface the source follower gate for a length of the intermediate portion substantially equal to a width of the source follower gate, for example, as described above.

In one example, each pixel cell 215 of the pixel array 210 in the imaging system 200 can further include a transfer gate disposed over the semiconductor material between the photodiode and the floating diffusion. The transfer gate is coupled to selectively transfer the image charge from the photodiode to the floating diffusion.

The tunnel contact can include an electrically conductive material (e.g., tungsten). Each pixel cell 215 of the pixel array 210 of the imaging system 200 can further include one or more trench isolation structures in the semiconductor material below the source follower gate and proximate to a channel region of the source follower transistor, wherein edges of the source follower gate extend laterally beyond outer edges of the trench isolation structures. In some embodiments, in a given pixel cell 215, the photodiode is a first photodiode of a plurality of photodiodes adapted to photogenerate image charge in response to incident light, and the transfer gate is a first transfer gate of a plurality of transfer gates. The pixel cell 215 can further include a second photodiode in the plurality of photodiodes, as described, for example in FIG. 2 and above.

In some embodiments, as discussed above, a given pixel cell 215 can include one or more inter-layer dielectric layers overlaying the semiconductor material. A given pixel cell 215 can further include one or more metal layers embedded in the one or more inter-layer dielectric layers, the one or more metal layers including a first metal interconnect coupled to provide a transfer control signal to the transfer gate through a first contact routed through the one or more inter-layer dielectric layers; a second metal interconnect coupled to provide a reset control signal to the reset gate through a second contact routed through the one or more inter-layer dielectric layers; and a third metal interconnect coupled to provide a reset voltage to the second doped region of the reset transistor through a third contact routed through the one or more inter-layer dielectric layers. The tunnel contact formed across a surface of the source follower gate is electrically isolated from the one or more metal layers embedded in the one or more inter-layer dielectric layers. For example, the one or more inter-layer dielectric layers can include a dielectric material disposed between the tunnel contact and the one or more metal layers.

In one example, imaging system 200 can be included in a digital camera, cell phone, laptop computer, automobile or the like. Additionally, imaging system 200 can be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware can deliver instructions to imaging system 200, extract image data from imaging system 200, or manipulate image data supplied by imaging system 200.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
    a floating diffusion disposed in a semiconductor material and coupled to receive image charge from a photodiode disposed in the semiconductor material;
    a transfer gate disposed over the semiconductor material proximate to the photodiode and the floating diffusion;
    a reset transistor having a first doped region and a second doped region in the semiconductor material and a reset gate disposed over the semiconductor material between the first and second doped regions of the reset transistor;
    a source follower transistor having a source follower gate disposed over the semiconductor material and disposed laterally between the transfer gate and the reset gate; and
    a tunnel contact coupling the floating diffusion to the source follower gate and the first doped region of the reset transistor.

2. The pixel cell of claim 1, wherein the tunnel contact is formed across a surface of the source follower gate, the tunnel contact having a first end, a second end, and an intermediate portion between the first and second ends, wherein the first end of the tunnel contact is coupled to the floating diffusion, wherein the second end of the tunnel contact is coupled to the first doped region of the reset transistor, and wherein the tunnel contact is in physical and in electrical contact with the surface of the source follower gate for a length of the intermediate portion substantially equal to a width of the source follower gate.

3. The pixel cell of claim 1, wherein the transfer gate is disposed between the photodiode and the floating diffusion, and wherein the transfer gate is coupled to selectively transfer the image charge from the photodiode to the floating diffusion.

4. The pixel cell of claim 1, wherein the tunnel contact comprises a conductive material.

5. The pixel cell of claim 4, wherein the tunnel contact comprises tungsten.

6. The pixel cell of claim 1, further comprising one or more trench isolation structures in the semiconductor material below the source follower gate and proximate to a channel region of the source follower transistor, wherein edges of the source follower gate extend laterally beyond outer edges of each of the trench isolation structures.

7. The pixel cell of claim 1, wherein the photodiode is a first photodiode of a plurality of photodiodes adapted to photogenerate image charge in response to incident light, wherein the transfer gate is a first transfer gate of a plurality of transfer gates, the pixel cell further comprising:
    a second photodiode included in the plurality of photodiodes, wherein the second photodiode is disposed in the semiconductor material; and
    a second transfer gate included in the plurality of transfer gates and disposed over the semiconductor material proximate to the second photodiode and the floating diffusion, wherein the second transfer gate is coupled to selectively transfer the image charge from the second photodiode to the floating diffusion.

8. The pixel cell of claim 1, further comprising:
one or more inter-layer dielectric layers overlaying the semiconductor material; and
one or more metal layers embedded in the one or more inter-layer dielectric layers, wherein the one or more metal layers comprise:
a first metal interconnect coupled to provide a transfer control signal to the transfer gate through a first contact routed through the one or more inter-layer dielectric layers;
a second metal interconnect coupled to provide a reset control signal to the reset gate through a second contact routed through the one or more inter-layer dielectric layers; and
a third metal interconnect coupled to provide a reset voltage to the second doped region of the reset transistor through a third contact routed through the one or more inter-layer dielectric layers.

9. The pixel cell of claim 8, wherein the tunnel contact is electrically isolated from the one or more metal layers embedded in the one or more inter-layer dielectric layers.

10. The pixel cell of claim 8, wherein the one or more inter-layer dielectric layers comprise a dielectric material disposed between the tunnel contact and the one or more metal layers.

11. An imaging system, comprising:
an array of pixel cells, wherein each one of the pixel cells comprises:
a floating diffusion disposed in a semiconductor material and coupled to receive image charge from a photodiode disposed in the semiconductor material;
a transfer gate disposed over the semiconductor material proximate to the photodiode and the floating diffusion;
a reset transistor having a first doped region and a second doped region in the semiconductor material and a reset gate disposed over the semiconductor material between the first and second doped regions of the reset transistor;
a source follower transistor having a source follower gate disposed over the semiconductor material and disposed laterally between the transfer gate and the reset gate; and
a tunnel contact coupling the floating diffusion to the source follower gate and the first doped region of the reset transistor;
a control circuitry coupled to the array of pixel cells to control operation of the array of pixel cells; and
a readout circuitry coupled to the array of pixel cells to read out image data from the array of pixel cells.

12. The imaging system of claim 11, wherein the tunnel contact is formed across a surface of the source follower gate, the tunnel contact having a first end, a second end, and an intermediate portion between the first and second ends, wherein the first end of the tunnel contact is coupled to the floating diffusion, wherein the second end of the tunnel contact is coupled to the first doped region of the reset transistor, and wherein the tunnel contact is in physical and in electrical contact with the surface the source follower gate for a length of the intermediate portion substantially equal to a width of the source follower gate.

13. The imaging system of claim 11, further comprising a function logic coupled to the readout circuitry to store image data from the pixel array.

14. The imaging system of claim 11, wherein the transfer gate is disposed between the photodiode and the floating diffusion, and wherein the transfer gate is coupled to selectively transfer the image charge from the photodiode to the floating diffusion.

15. The imaging system of claim 11, wherein the tunnel contact comprises a conductive material.

16. The imaging system of claim 15, wherein the tunnel contact comprises tungsten.

17. The imaging system of claim 11, wherein each pixel cell further comprises one or more trench isolation structures in the semiconductor material below the source follower gate and proximate to a channel region of the source follower transistor, wherein edges of the source follower gate extend laterally beyond outer edges of each of the trench isolation structures.

18. The imaging system of claim 11, wherein the photodiode is a first photodiode of a plurality of photodiodes adapted to photogenerate image charges in response to incident light, wherein the transfer gate is a first transfer gate of a plurality of transfer gates, wherein each pixel cell further comprises:
a second photodiode included in the plurality of photodiodes, wherein the second photodiode is disposed in the semiconductor material; and
a second transfer gate included in the plurality of transfer gates and disposed over the semiconductor material proximate to the second photodiode and the floating diffusion, wherein the second transfer gate is coupled to selectively transfer the image charge from the second photodiode to the floating diffusion.

19. The imaging system of claim 11, wherein each pixel cell further comprises:
one or more inter-layer dielectric layers overlaying the semiconductor material; and
one or more metal layers embedded in the one or more inter-layer dielectric layers, wherein the one or more metal layers include:
a first metal interconnect coupled to provide a transfer control signal to the transfer gate through a first contact routed through the one or more inter-layer dielectric layers;
a second metal interconnect coupled to provide a reset control signal to the reset gate through a second contact routed through the one or more inter-layer dielectric layers; and
a third metal interconnect coupled to provide a reset voltage to the second doped region of the reset transistor through a third contact routed through the one or more inter-layer dielectric layer.

20. The imaging system of claim 19, wherein tunnel contact is electrically isolated from the one or more metal layers embedded in the one or more inter-layer dielectric layers.

21. The imaging system of claim 19, wherein the one or more inter-layer dielectric layers include a dielectric material disposed between the tunnel contact and the one or more metal layers.

22. A method of making a pixel cell, comprising:
providing a semiconductor material;
forming a photodiode, a floating diffusion, a source follower transistor, and a first doped region and a second doped region of a reset transistor in the semiconductor material;
forming a transfer gate, a source follower gate, a reset transistor gate over a first side of the semiconductor material;

forming an inter-layer dielectric layer over the first side of the semiconductor material, and embedding the transfer gate, the source follower gate, and the reset transistor gate;

patterning and etching the inter-layer dielectric layer to provide a first exposed region over the floating diffusion, a second exposed region over the source follower gate, and a third exposed region over the first doped region of the reset transistor; and depositing an electrically conductive material in the first exposed region over the floating diffusion, the second exposed region over the source follower gate, and the third exposed region over the first doped region of the reset transistor to form a tunnel contact electrically coupling the floating diffusion to the source follower gate and the first doped region of the reset transistor.

23. The method of claim 22, wherein depositing the electrically conductive material to form the tunnel contact comprises forming the tunnel contact having a first end, a second end, and an intermediate portion between the first and second ends, wherein the first end is formed in contact with the floating diffusion, wherein the second end is formed in contact to the first doped region of the reset transistor, and wherein the tunnel contact is formed in physical and in electrical contact with a surface of the source follower gate for a length of the intermediate portion substantially equal to a width of the source follower gate.

24. The method of claim 22, further comprising etching a surface of the tunnel contact to thin the intermediate portion of the tunnel contact forming a gap between an upper surface of the tunnel contact and the inter-layer dielectric layer.

25. The method of claim 24, further comprising depositing a dielectric material over the etched surface of the tunnel contact to fill the gap between an upper surface of the tunnel contact and the inter-layer dielectric layer.

26. The method of claim 25, wherein said depositing the dielectric material over the etched surface of the tunnel contact comprises depositing the dielectric material over the etched surface of the tunnel contact to a predetermined height, wherein an upper surface of the dielectric material is coplanar with an upper surface of the inter-layer dielectric layer.

27. The method of claim 26, wherein the dielectric material comprises a same material as the inter-layer dielectric layer.

28. The method of claim 26, wherein the dielectric material comprises a different material than a material of the inter-layer dielectric layer.

29. The method of claim 22, wherein depositing the electrically conductive material in the first exposed region over the floating diffusion, in the second exposed region over the source follower gate, and in the third exposed region over the first doped region of the reset transistor comprises depositing tungsten in the first exposed region, the second exposed region, and the third exposed region.

30. The method of claim 22, further comprising forming a trench isolation structure in the semiconductor material below the source follower gate and between the floating diffusion and the source follower transistor, wherein the edges of the source follower gate extend laterally beyond outer edges of each of the trench isolation structures.

31. The method of claim 22, wherein the inter-layer dielectric layer is a first inter-layer dielectric layer of a plurality of inter-layer dielectric layers overlaying the semiconductor material, the method further comprising:

forming one or more other inter-layer dielectric layers of the plurality of inter-layer dielectric layers over the first interlayer dielectric layer such that the first inter-layer dielectric layer is disposed between the semiconductor material and the one or more other inter-layer dielectric layers;

forming one or more metal layers embedded in the one or more other inter-layer dielectric layers, wherein said forming the one or more metal layers comprises:

forming a first metal interconnect coupled transfer gate contact to provide a transfer control signal to the transfer gate through the transfer gate contact routed through the first inter-layer dielectric layer;

forming a second metal interconnect coupled to provide a reset control signal to the reset gate through a reset gate contact routed through the first inter-layer dielectric layer; and forming a third metal interconnect coupled to provide a reset voltage to the second doped region of the reset transistor through a third contact routed through the first inter-layer dielectric layer.

* * * * *